United States Patent [19]

Wolf et al.

[11] Patent Number: 5,470,689
[45] Date of Patent: Nov. 28, 1995

[54] POLYMERISABLE COMPOSITIONS CONTAINING TETRAACRYLATES

[75] Inventors: Jean-Pierre Wolf, Courtaman; Adrian Schulthess, Tentlingen; Bettina Steinmann, Praroman; Max Hunziker, Düdingen, all of Switzerland

[73] Assignee: Ciba-Geigy AG, Ardsley, N.Y.

[21] Appl. No.: 200,982

[22] Filed: Feb. 24, 1994

[30] Foreign Application Priority Data

Mar. 5, 1993 [CH] Switzerland .................. 681/93

[51] Int. Cl.$^6$ .................................. G03C 5/00
[52] U.S. Cl. .................. 430/269; 430/286; 522/181;
522/182; 425/174.4; 264/401
[58] Field of Search ................... 430/269, 286;
425/174.4; 264/22; 522/181, 182

[56] References Cited

U.S. PATENT DOCUMENTS 4,575,330  3/1986  Hull ........................... 425/174.4

FOREIGN PATENT DOCUMENTS

| 125862 | 11/1984 | European Pat. Off. |
| 425441 | 5/1991 | European Pat. Off. |
| 506616 | 9/1992 | European Pat. Off. |
| 54-22498 | 2/1979 | Japan. |

OTHER PUBLICATIONS

Derwent Abstract An 79-24569B (JP-A-54022498) Feb. 1979.

Derwent 91-126891[18] (Abstract of EP 0425441 May 1991).

*Primary Examiner*—Mark A. Chapman
*Attorney, Agent, or Firm*—William A. Teoli, Jr.

[57]  ABSTRACT

Photopolymerisable compositions comprising
(a) a tetraacrylate of formula I or II

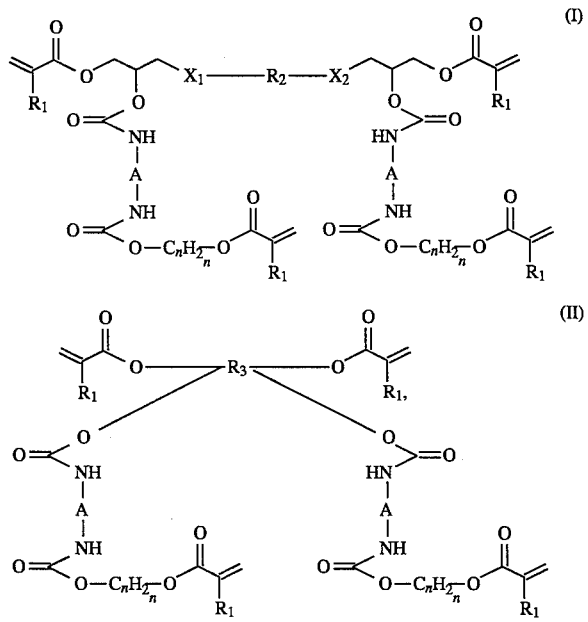

wherein
$R_1$ is a hydrogen atom or methyl,
$X_1$ and $X_2$ are each independently of the other —O— or —CO—O—,
$R_2$ is a divalent aliphatic, cycloaliphatic or aromatic radical of a diglycidyl compound that contains no more glycidyl ether or ester groups,
A is a divalent aliphatic, cycloaliphatic or aromatic radical of a diisocyanate compound that contains no more isocyanate groups,
n is an integer from 1 to 8, and
$R_3$ is a tetravalent cycloaliphatic radical of a diepoxide compound that contains no more 1,2-epoxide groups at the cycloaliphatischen ring,
(b) at least one liquid radically polymerisable compound that differs from component a), and
(c) a radical photoinitiator, are suitable preferably for the production of three-dimensional objects by the stereolithographic technique.

9 Claims, No Drawings

POLYMERISABLE COMPOSITIONS CONTAINING TETRAACRYLATES

Polymerisable compositions containing tetraacrylates

The present invention relates to the use of specific tetraacrylates as formulation components for photopolymerisable resin compositions that are preferably used in stereolithographic techniques, to novel photosensitive compositions based on acrylates and containing said specific tetraacrylates, and to a process for the production of moulded objects or coatings, in particular for making three-dimensional objects by the stereolithographic technique.

Radiation-sensitive liquid resins or resin systems that are suitable for forming three-dimensional objects by the stereolithographic technique disclosed in U.S. Pat. No. 4,575,330 are known, but many resins prove to be too viscous, whereas others are too insufficiently light-sensitive or, during the cure, suffer too severe shrinkage. The strength properties of the objects fabricated from photocured resins are also often unsatisfactory.

According to the teaching of EP-A-0 425 441, it is possible to enhance the impact strength and elongation at break of three-dimensional objects by adding a urethane (meth)acrylate having a functionality of 2 to 4 to a photosensitive composition for the production of three-dimensional objects by the stereolithographic technique. However, the green strength and the modulus of elasticity of these objects are simultaneously reduced.

It has now been found that tetraacrylates of formula I or II below, which are highly viscous compounds, are highly suitable formulation components for resin compositions that are used in stereolithographic techniques, and that by using such resin compositions which contain tetraacrylates it is possible to influence beneficially and simultaneously a number of mechanical properties of the objects prepared therefrom, typically the green strength, the modulus of elasticity, the elongation at break and the impact strength.

Accordingly, the invention relates to the use of tetraacrylates of formula I or II

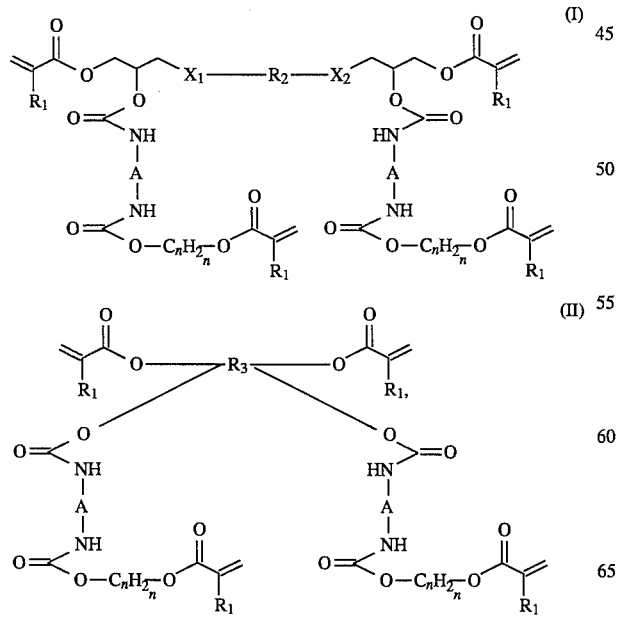

wherein $R_1$ is a hydrogen atom or methyl, $X_1$ and $X_2$ are each independently of the other —O— or —CO—O—, $R_2$ is a divalent aliphatic, cycloaliphatic or aromatic radical of a diglycidyl compound that contains no more glycidyl ether or ester groups, A is a divalent aliphatic, cycloaliphatic or aromatic radical of a diisocyanate compound that contains no more isocyanate groups, n is an integer from 1 to 8, and $R_3$ is a tetravalent cycloaliphatic radical of a diepoxide compound that contains no more 1,2-epoxide groups at the cycloaliphatischen ring, as formulation components of curable resin compositions that are used in stereolithographic techniques.

The preferred formulation component is a tetraacrylate of formula I or II, wherein $R_1$ is a hydrogen atom or methyl, $X_1$ and $X_2$ are each —O— or —CO—O—, $R_2$ is a divalent linear or branched hydrocarbon radical of up to 20 carbon atoms, a radical of formula -(alkylene-O)$_m$-alkylene-, in which alkylene contains 1 to 8 carbon atoms and m is 0 or an integer from 1 to 100, also

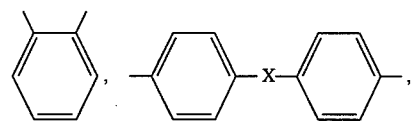

in which

X is linear or branched alkylene of 1 to 6 carbon atoms,

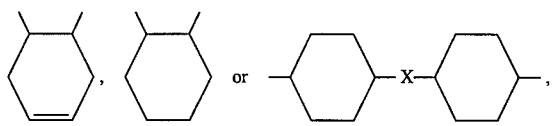

in which X is as defined above,

A is a divalent divalent aliphatic hydrocarbon radical of up to 6 carbon atoms, an unsubstituted or methyl-substituted phenylene radical, a radical of formula

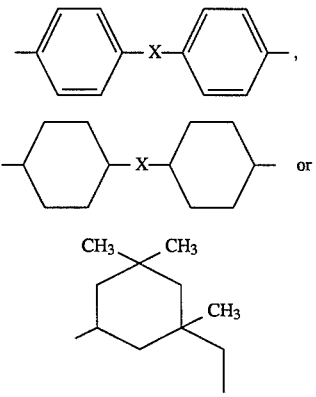

in which
X is as defined above, and
$R_3$ is a radical of formula

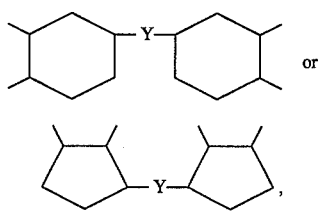

in which Y is —CO—O—CH$_2$—, —CO—O—(CH$_2$)$_p$ —O—CO— or —CH$_2$—O—CO—(CH$_2$)$_p$ —CO—O—CH$_2$—, and p is an integer from 2 to 12.

The invention also relates to photopolymerisable compositions comprising (a) a tetraacrylate of formula I or II

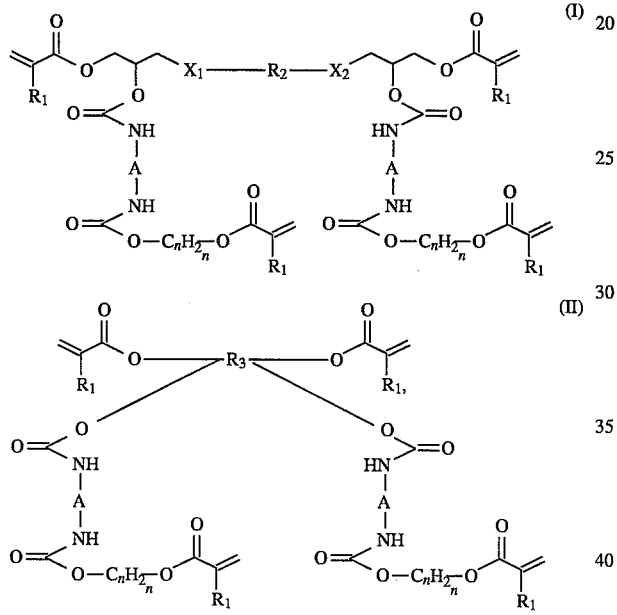

wherein $R_1$ is a hydrogen atom or methyl, $X_1$ and $X_2$ are each independently of the other —O— or —CO—O—, $R_2$ is a divalent aliphatic, cycloaliphatic or aromatic radical of a diglycidyl compound that contains no more glycidyl ether or ester groups, A is a divalent aliphatic, cycloaliphatic or aromatic radical of a diisocyanate compound that contains no more isocyanate groups, n is an integer from 1 to 8, and $R_3$ is a tetravalent cycloaliphatic radical of a diepoxide compound that contains no more 1,2-epoxide groups at the cycloaliphatischen ring, (b) at least one liquid, radically polymerisable compound that differs from component a), and (c) a radical photoinitiator.

Preferably component (a) of the novel compositions is a tetraacrylate of formula I or II, wherein $R_1$ is a hydrogen atom or methyl, $X_1$ and $X_2$ are each —O— or —CO—O—, $R_2$ is a divalent linear or branched hydrocarbon radical of up to 20 carbon atoms, a radical of formula -(alkylene-O)$_m$-alkylene-, in which alkylene contains 1 to 8 carbon atoms and m is 0 or an integer from 1 to 100, also

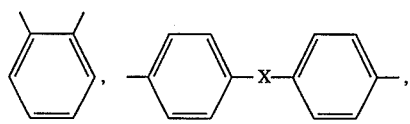

in which

X is linear or branched alkylene of 1 to 6 carbon atoms,

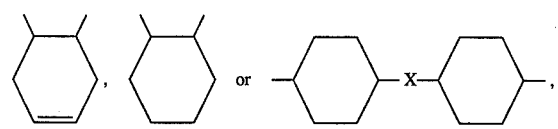

in which X is as defined above,

A is a divalent aliphatic hydrocarbon radical of up to 6 carbon atoms, an unsubstituted or a methyl-substituted phenylene radical, a radical of formula

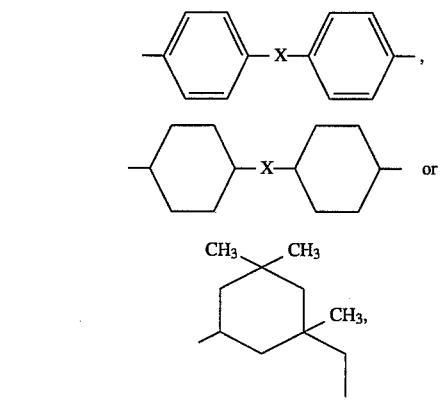

in which X is as defined above, and $R_3$ is a radical of formula

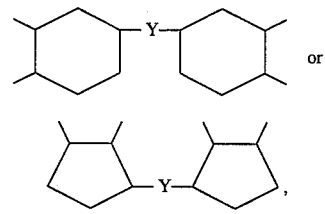

in which Y is —CO—O—CH$_2$—, —CO—O—(CH$_2$)$_p$ —O—CO— or —CH$_2$—O—CO—(CH$_2$)$_p$ —CO—O—CH$_2$—, and p is an integer from 2 to 12.

Some of the tetraacrylates of formula I or II are known compounds and are disclosed in JP 54/022498, in which generally reaction products of diepoxides with acrylic acid, diisocyanates and hydroxyalkylacrylates are described.

The tetraacrylates of formula I or II can be prepared in simple manner, conveniently by reacting an aliphatic, cycloaliphatic or aromatic diglycidyl ether or ester or a cycloaliphatic diepoxide, wherein the epoxide groups form part of an alicyclic ring system, with (meth)acrylic acid, in the molar ratio 1:2, to give the corresponding epoxy diacrylate, then reacting said diacrylate with an aliphatic, cycloaliphatic or aromatic diisocyanate, in the molar ratio 1:2, and reacting the resultant adduct with the hydroxyalkylacrylate of formula III

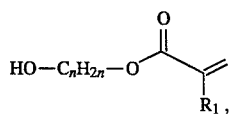

in the molar ratio 1:2, wherein $R_1$ is a hydrogen atom or methyl, and n is an integer from 1 to 8.

Aliphatic, cycloaliphatic or aromatic diglycidyl ethers which may suitably be used in the practice of this invention are typically the epoxy resins obtained in known manner by reacting acyclic diols such as ethylene glycol, diethylene glycol and higher poly(oxyethylene) glycols, 1,2-propanediol or poly(oxypropylene) glycols, 1,3-propanediol, 1,4-butanediol, poly(oxytetramethylene) glycols, 1,5-pentanediol or 1,6-hexanediol, cycloaliphatic alcohols such as 1,4-cyclohexanedimethanol, bis(4-hydroxycyclohexyl)methane, 2,2-bis(4-hydroxycyclohexyl)propane, N,N-bis(2-hydroxyethyl)aniline or p,p'-bis(2-hydroxyethylamino)diphenylmethane, or dihydric phenols such as resorcinol or hydroquinone, or dihydric polynuclear phenols such as bis(4-hydroxyphenyl)methane, 4,4'-dihydroxybiphenyl, bis(4-hydroxyphenyl)sulfone, 2,2-bis(4-hydroxyphenyl)propane or 2,2-bis(3,5-dibromo-4-hydroxyphenyl)propane with epichlorohydrin or β-methylepichlorohydrin. Such products are known and some are commercially available.

Aliphatic, cycloaliphatic or aromatic diglycidyl esters which may suitably be used in the practice of this invention are the epoxy resins obtained by reacting aliphatic, cycloaliphatic or aromatic dicarboxylic acids such as oxalic acid, succinic acid, glutaric acid, adipic acid, pimelic acid, suberic acid, azelaic acid, dimerised or trimerised linoleic acid, tetrahydrophthalic acid, 4-methyltetrahydrophthalic acid, hexahydrophthalic acid, 4-methylhexahydrophthalic acid, phthalic acid, isophthalic acid or terephthalic acid, with epichlorohydrin or β-methylepichlorohydrin. Such products are likewise known and some are commercially available. Diepoxides that contain a glycidyl ether as well as a glycidyl ester group in the molecule can also be used. Such compounds are obtained in known manner by glycidylation of hydroxycarboxylic acids, typically salicylic acid.

Suitable cycloaliphatic diepoxides wherein the epoxy groups form part of an alicyclic ring system are conveniently bis(2,3-epoxycyclopentyl) ether, 1,2-bis(2,3-epoxycyclopentyloxy)ethane, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, bis(3,4-epoxycyclohexylmethyl)hexanedioate, bis(3,4-epoxy-6-methylcyclohexylmethyl)hexanedioate, ethylenebis(3,4-epoxycyclohexanecarboxylate), ethanediol bis(3,4-epoxycyclohexylmethyl)ether, dicyclopentadienediepoxide or 2-(3,4-epoxycyclohexyl-5,5-spiro-3,4-epoxy)cyclohexane-1,3-dioxane. Such diepoxides are also known and some are commercially available.

A suitable aliphatic, cycloaliphatic or aromatic diisocyanate may typically be hexamethylene diisocyanate, trimethylhexamethylene diisocyanate, cyclohexane diisocyanate, isophorone diisocyanate (3,5,5-trimethyl-1-isocyanato-3-isocyanatometliylcyclohexane), methylene dicyclohexyl diisocyanate, p-phenylene diisocyanate, 2,4-diisocyanatotoluene, 2,6-diisocyanatotoluene and technical mixtures of both isomers, naphthylene diisocyanate, preferably 1,5-naphthylene diisocyanate, dianisidine diisocyanate, methylene diphenyl diisocyanate, preferably the 4,4'-isomers, and also technical mixtures of different isomers, typically the 4,4'- and 2,4'-isomers, or polymethylene polyphenylene diisocyanates.

The hydroxyalkylacrylates of formula III are likewise known compounds.

Component (b) of the novel compositions may be a customary radically polymerisable compound, typically a monoacrylate, di- or polyacrylate having an acrylate functionality of up to 9, as well as vinyl compounds having a vinyl functionality of up to 6.

Suitable monoacrylates are typically allyl acrylate, allyl methacrylate, methyl (meth)acrylate, ethyl (meth)acrylate, n-propyl (meth)acrylate, n-butyl (meth)acrylate, isobutyl (meth)acrylate, n-hexyl (meth)acrylate, 2-ethylhexyl (meth)acrylate, n-octyl (meth)acrylate, n-decyl (meth)acrylate and n-dodecyl (meth)acrylate, 2-hydroxyethyl (meth)acrylate, 2- and 3-hydroxypropyl (meth)acrylate, 2-methoxyethyl (meth)acrylate, 2-ethoxyethyl (meth)acrylate and 2- or 3-ethoxypropyl (meth)acrylate, tetrahydrofurfurylmethacrylate, 2-(2-ethoxyethoxy)ethylacrylate, cyclohexyl methacrylate, 2-phenoxyethyl acrylate, glycidyl acrylate and isodecyl acrylate. Such products are also known and some are commercially available, as from SARTOMER.

Diacrylates suitable for use as component (b) are typically the diacrylates of cycloaliphatic or aromatic diols such as 1,4-dihydroxymetylcyclohexane, 2,2-bis(4-hydroxycyclohexyl)propane, bis(4-hydroxycyclohexyl)methane, hydroquinone, 4,4'-dihydroxybiphenyl, bisphenol A, bisphenol F, bisphenol S, ethoxylated or propoxylated bisphenol A, ethoxylated or propoxylated bisphenol F, or ethoxylated or propoxylated bisphenol S. Such diacrylates are known and some are commercially available.

Suitable diacrylates are also compounds of formula IV, V, VI or VII

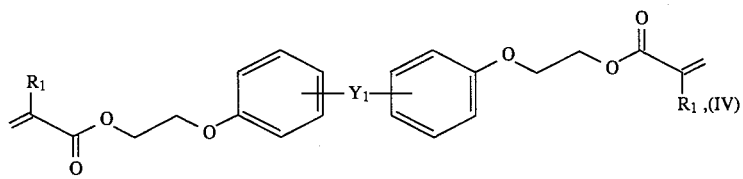

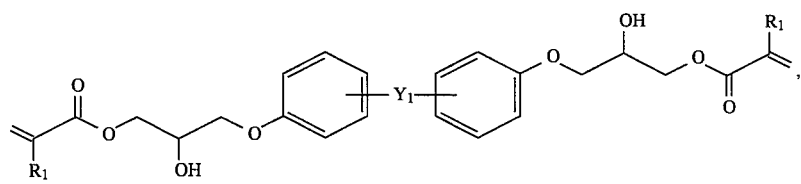

-continued

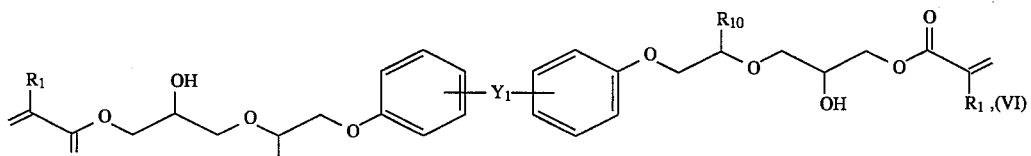
(VI)

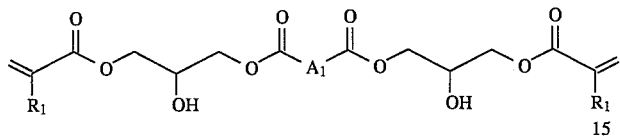

wherein $R_1$ is a hydrogen atom or methyl, $Y_1$ is a direct bond, $C_1$-$C_6$alkylene, —S—, —O—, —SO—, —SO$_2$— or —CO—, $R_{10}$ is a $C_1$-$C_8$alkyl group, an unsubstituted phenyl group or a phenyl group which is substituted by one or more than one $C_1$-$C_4$alkyl group, hydroxy group or halogen atom, or is a radical of formula —CH$_2$—OR$_{11}$, wherein $R_{11}$ is a $C_1$-$C_8$alkyl group or a phenyl group, and $A_1$ is a radical of formula

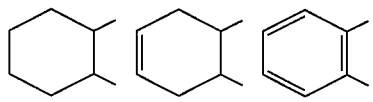

The diacrylates of formulae IV arid V are known and some are commercially available, for example under the registered trademarks SR®349 or Novacure®3700, and can be prepared by reacting ethoxylated bisphenols, in particular ethoxylated bisphenol A, or a diglycidyl ether of a bisphenol, preferably the diglycidyl ether of bisphenol A, with (meth)acrylic acid to the compounds of formulae IV or V.

In the same manner, the compounds of formulae VI and VII can be prepared by reacting a diglycidyl ether of formula VIa

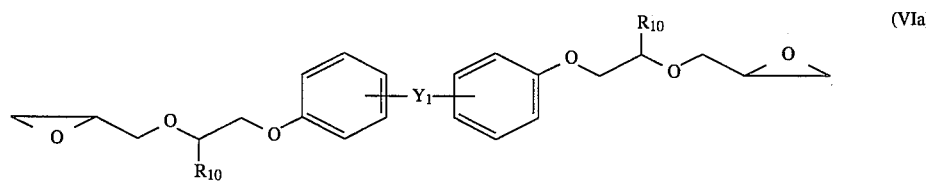
(VIa)

or a diglycidyl ester of formula VIIa

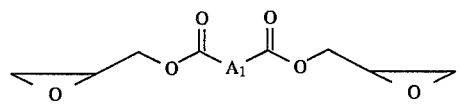
(VIIa)

with (meth)acrylic acid to the compounds of formula VI or VII, wherein $R_{10}$, $Y_1$ and $A_1$ are as defined above.

Further suitable diacrylates are compounds of formula VIII, IX, X and XI

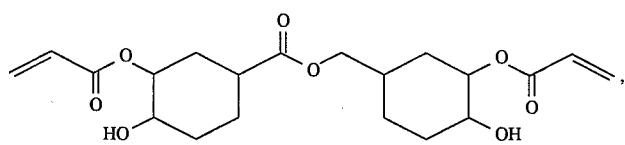
(VIII)

-continued

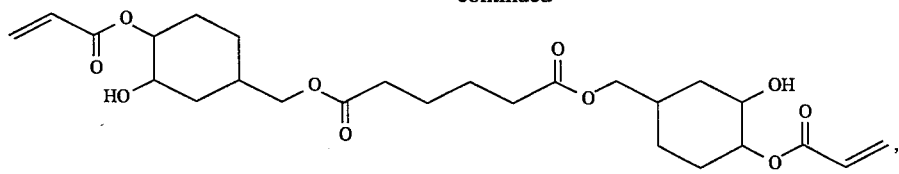 (IX)

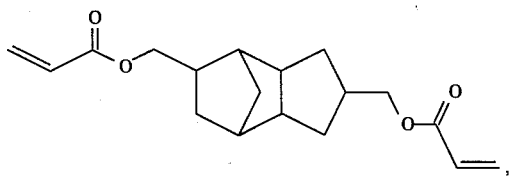 (X)

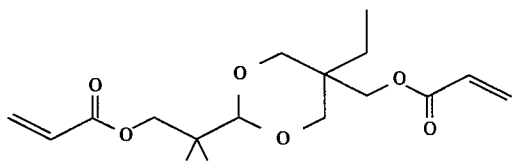 (XI)

These compounds are known and some are commercially available. For example, the compounds of formulae VIII and IX can be obtained in known manner by reacting the cycloaliphatic diepoxides of formulae VIIIa and IXa

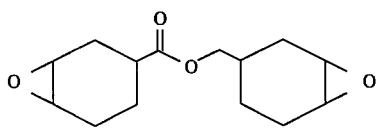 (VIIIa)

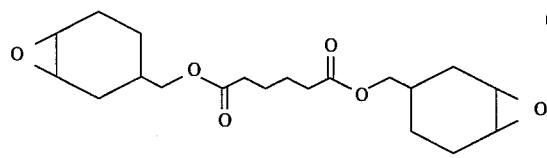 (IXa)

with (meth)acrylic acid to the compounds of formula VIII or IX. The compound of formula XI is commercially available under the registered trademark Kayarad®R-604.

The liquid poly(meth)acrylates having a (meth)acrylate functionality greater than 2 used in the novel compositions as component (b) may typically be tri-, tetra- or pentafunctional monomeric or oligomeric aliphatic, cycloaliphatic or aromatic acrylates or methacrylates.

Suitable aliphatic polyfunctional (meth)acrylates are typically the triacrylates and trimethacrylates of hexane-2,4,6-triol, glycerol or 1,1,1-trimethylolpropane, ethoxylated or propoxylated glycerol or 1,1,1-trimethylolpropane, and the hydroxy group-containing tri(meth)acrylates which are obtained by reaction of triepoxides, such as the triglycidyl ethers of the cited triols, with (moth)acrylic acid. It is also possible to use pentaerythritol tetraacrylate, bis(trimethylol)propane tetraacrylate, pentaerythritol monohydroxy triacrylate or methacrylate, or dipentaerythritol monohydroxy pentaacrylate or methacrylate.

Hexafunctional or higher functional urethane acrylates or urethane methacrylates can also be used as component (b). Those skilled in the art are familiar with these urethane (meth)acrylates, which can be prepared in known manner by reacting a hydroxyl-terminated polyurethane with acrylic acid or methacrylic acid, or by reacting an isocyanate-terminated prepolymer with hydroxyalkyl (meth)acrylates to the urethane (meth)acrylate.

Suitable aromatic tri(meth)acrylates are typically reaction products of triglycidyl ethers of trihydric phenols and trihydroxylated phenol or cresol novolaks with (meth)acrylic acid.

It is preferred that the novel compositions contain as component (b) at least one liquid (meth)acrylate that differs from component (a) and has a an acrylate functionality of 1 to 9.

In particular, the novel compositions contain as component (b) at least one liquid mixture of aromatic, aliphatic or cycloaliphatic (meth)acrylates that differ from component (a) and have an acrylate functionality of 1 to 9.

Most preferably, the novel compositions contain as component (b) a liquid mixture of at least one polyalkylene glycol (meth)acrylate and at least one aromatic, aliphatic or cycloaliphatic (meth)acrylate having an acrylate functionality of 1 to 9.

Any type of photoinitiator which, when suitably irradiated, forms free radicals can be used as component (c) in the novel compositions. Typical known photoinitiators are benzoins, such as benzoin, benzoin ethers, including benzoin methyl ether, benzoin ethyl ether and benzoin isopropyl ether, benzoin phenyl ether and benzoin acetate; acetophenones, including acetophenone, 2,2-dimethoxyacetophenone and 1,1-dichloroacetophenone; benzil, benzil ketals such as benzil dimethyl ketal and benzil diethyl ketal; anthraquinones, including 2-methylanthraquinone, 2-ethylanthraquinone, 2-tert-butylanthraquinone, 1-chloroanthraquinone and 2-amylanthraquinone; triphenylphosphine; benzoylphosphine oxides, for example 2,4,6-trimethylbenzoyl diphenylphosphine oxide (Luzirin TPO); benzophenones such as benzophenone and 4,4'-bis(N,N'-dimethylamino)benzophenone; thioxanthones and xanthones; acridine derivatives; phenazine derivatives; quinoxaline derivatives or 1-phenyl-1,2-propanedione; 2-O-benzoyl oxime; 1-aminophenyl ketones or 1-hydroxyphenyl ketones such as 1-hydroxycyclohexyl phenyl ketone, phenyl 1-hydroxyisopropyl ketone and 4-isopropylphenyl-1-(hydroxyisopropyl) ketone, all of which are known compounds.

Particularly suitable photoinitiators which are normally used in conjunction with a He/Cd laser as light source are acetophenones, including 2,2-dialkoxybenzophenones and 1-hydroxyphenylketones, typically 1-hydroxycyclohexyl phenyl ketone or 2-hydroxyisopropyl phenyl ketone (=

2-hydroxy-2,2-dimethylacetophenone). 1-Hydroxycyclohexyl phenyl ketone is preferred.

Another class of photoinitiators (c) normally used when irradiating with argon ion lasers are the benzil ketals, typically benzil dimethyl ketal. It is particularly preferred to use as photoinitiator an α-hydroxyphenyl ketone, benzil dimethyl ketal or 2,4,6-trimethylbenzoyl diphenylphosphine oxide.

Another class of suitable photoinitiators (c) comprises the ionic dye-counter ion compounds which are capable of absorbing actinic radiation and generating free radicals which initiate the polymerisation of the acrylates. The compositions of the invention containing ionic dye-counter ion compounds can be cured more variably in this way with visible light within the adjustable wavelength range of 400–700 nm. Ionic dye-counter ion compounds and their mode of action are disclosed inter alia, in EP-A-0 223 587 and U.S. Pat. Nos. 4,751,102; 4,772,530, and 4,772,541. Typical examples of suitable ionic dye-counter ion compounds are the anionic dye-iodonium ion complexes, the anionic dye-pyrylium ion complexes and, especially, the cationic dye-borate anion compounds of formula

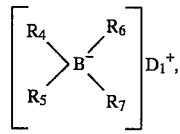

wherein $D_1^+$ is a cationic dye and $R_4$, $R_5$, $R_6$ and $R_7$ are each independently of one another an alkyl, aryl, alkaryl, allyl, aralkyl, alkenyl or alkynyl group, or an alicyclic or saturated or unsaturated heterocyclic group. Preferred definitions of $R_4$ to $R_7$ will be found in EP-A-0 223 587.

It is common practice to add the photoinitiators in effective mounts, i.e. in amounts of c.0.1 to 10% by weight, based on the total amount of the composition. If the novel compositions are used for stereolithographic techniques in which laser beams are normally used, it is essential to adjust the absorption capacity of the mixtures by the type and concentration of the photoinitiator such that the depth of cure at normal laser speed is about 0.1 to 2.5 mm.

Photoinitiator (c) in the novel compositions is preferably a 1-hydroxyphenyl ketone, most preferably 1-hydroxycyclohexyl phenyl ketone.

The novel compositions preferably comprise 5 to 75% by weight of a compound of formula I or II as component (a), 25 to 95% by weight of component (b), the amount of components (a) and (b) together being 100% by weight, and 0.1 to 10% by weight, based on the amount of (a) and (b), of component (c).

More particularly the novel compositions comprise 10 to 50% by weight of a compound of formula I or II as component (a), 50 to 90% by weight of component (b), the amount of components (a) and (b) together being 100% by weight, and 0.1 to 10% by weight, based on the amount of (a) and (b), of component (c).

If desired, customary additives can be added to the compositions of this invention, typically stabilisers such as UV stabilisers, polymerisation inhibitors, slip agents, wetting agents, flow control agents, sensitisers, antiprecipitants, surfactants, dyes, pigments or fillers. The novel compositions can be prepared in known manner, conveniently by premixing individual components and subsequently blending these premixes, or by blending all components in conventional apparatus, such as stirred vessels, excluding light and at slightly elevated temperature.

The novel photosensitive compositions can be polymerised by irradiation with actinic light, typically with electron beams, X-rays, UV or VIS light, i.e. with radiation in the wavelength range from 280–650 nm. Particularly suitable light sources are HeCd, argon or nitrogen laser light as well as metal vapour and NdYAG lasers with multiple frequency. Those skilled in the art will know that the appropriate photoinitiator for each selected light source must be chosen and, if necessary, sensitised. It has been found that the depth of penetration of the radiation into the polymerised composition and the processing rate are directly related to the absorption coefficient and the concentration of the photoinitiator.

The novel compositions may also contain other photoinitiators of different sensitivity to radiation of emission lines of different wavelengths. The inclusion of such photoinitiators effects the better utilisation of a UV/VIS light source which radiates emission lines of different wavelength. It is advantageous to choose these other photoinitiators and to use them in a concentration such that a uniform optical absorption is produced with respect to the emission lines used.

The novel compositions of this invention, which have a high and comparatively enhanced photosensitivity, are preferably suitable for the production of three-dimensional objects by the stereolithographic technique and give objects that are distinguished by superior green strength, a high modulus of elasticity and, at the same time, superior elongation at break and impact strength.

The invention accordingly also relates to a process for the production of three-dimensional objects from the novel liquid compositions by a lithographic technique, which comprises irradiating a layer of novel liquid composition over the entire surface or in a predetermined pattern with actinic light from a UV/VIS light source, such that within the irradiated areas a layer solidifes in a desired layer thickness, then a new layer of novel composition is formed on the solidified layer, which layer is likewise irradiated over the entire surface or in a predetermined pattern, and such that three-dimensional objects are formed from a plurality of solidified layers which adhere to one another by repeated coating and irradiation. In this process the preferred UV/VIS light source is a laser beam which, in a particularly preferred embodiment of the invention, is computer-controlled.

If the novel compositions are used as coating compositions, clear and hard coats are obtained on wood, paper, metal, ceramic or other surfaces. The coating thickness can vary over a very wide range and be from c. 1 µm to c. 1 µm. Relief images for printed circuit boards or printing plates can be produced from the novel compositions, conveniently by computer-controlled laser light of appropriate wavelength or using a photomask and a suitable light source.

Another utility of the novel compositions is as photocurable adhesives.

It is preferred to use the novel compositions for the production of photopolymerised layers, especially in the form of three-dimensional objects which are formed from a plurality of solidified layers which adhere to one another.

The invention also relates to the three-dimensional objects which are obtained by irradiating the novel compositions with actinic light and are formed from a plurality of solidified layers which adhere to one another.

Preparation of the tetraacrylates

Example A (Tetraacrylate A)

96.8 g (0.2 mol) of Novacure®3700 (commercial product of Radcure), a diacrylate obtainable by reacting a diglycidyl ether of bisphenol A with acrylic acid in the molar ratio of 1:2) are slowly added dropwise at 50° C. to a solution of 88.9 g (0.4 mol) of isophorone diisocyanate (1-cyanato-3-cyanatomethyl-3,5,5-trimethylcyclohexane), 0.16 g of tin octoate and 0.18 g of Ralox® (2,2'-methylene-bis(4,6-di-tert-butylphenol), sold by Raschig), and the reaction solution is stirred for 5 hours (h) at 55° C. The isocyanate content of the reaction solution determined by titration is at this time 2.2 mol/kg (theory: 2.16 mol/kg).

The temperature of the reaction solution subsequently is raised to 85° C. and 52.8 g (0.41 mol) of hydroxyethyl acrylate (Fluka, 90% pure) are added dropwise. The reaction solution is further stirred until the isocyanate groups disappear. After stirring for 4 h, the resultant tetraacrylate has a molecular weight (Mn) of 1664 determined by gel permeation chromatography (GPC). The quotient Mw/Mn of the weight average (Mw) and the molecular weight (Mn) is 2.65. The resultant tetraacrylate has the formula molar ratio of 1:2, and 62 g (0.46 mol) of hydroxyethyl acrylate in the presence of 0.16 g of tin octoate and 0.17 g of Ralox®.

Analysis by GPC shows the resultant tetraacrylate to have a Mn of 1098 and a Mw/Mn of 1.66, and it has the formula

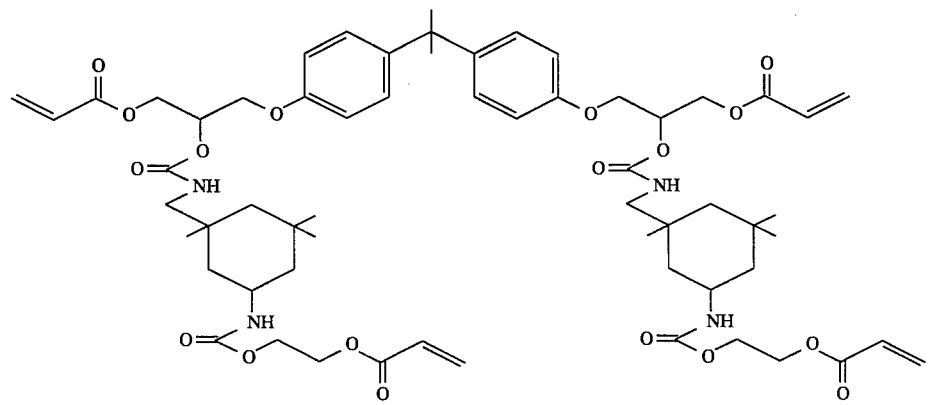

Example B (Tetraacrylate B)

Tetraacrylate B is prepared in general accordance with the procedure described for the preparation of tetraacrylate A by reacting 88.9 g (0.4 mol) of isophorone diisocyanate, 85.6 g

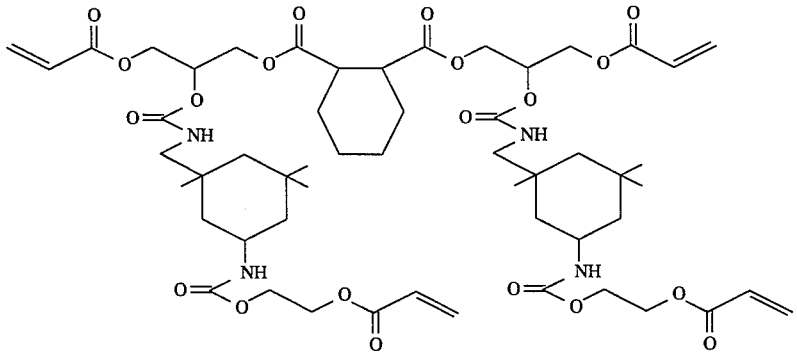

(0.2 mol) of a diacrylate obtainable by reacting the diglycidyl ether of hexahydrophthalic acid with acrylic acid in the

Example C (Tetraacrylate C)

Tetraacrylate C is prepared in general accordance with the procedure described for the preparation of tetraacrylate A by reacting 88.9 g (0.4 mol) of isophorone diisocyanate, 85.6 g (0.2 mol) of a diacrylate obtainable by reacting bis(3,4-epoxycyclohexyl)adipate with acrylic acid in the molar ratio of 1:2, and 58 g (0.43 mol) of hydroxyethyl acrylate in the presence of 0.16 g of tin octoate and 0.19 g of Ralox®.

Analysis by GPC shows the resultant tetraacrylate to have a Mn of 1297 and a Mw/Mn of 3.67, and it has the formula

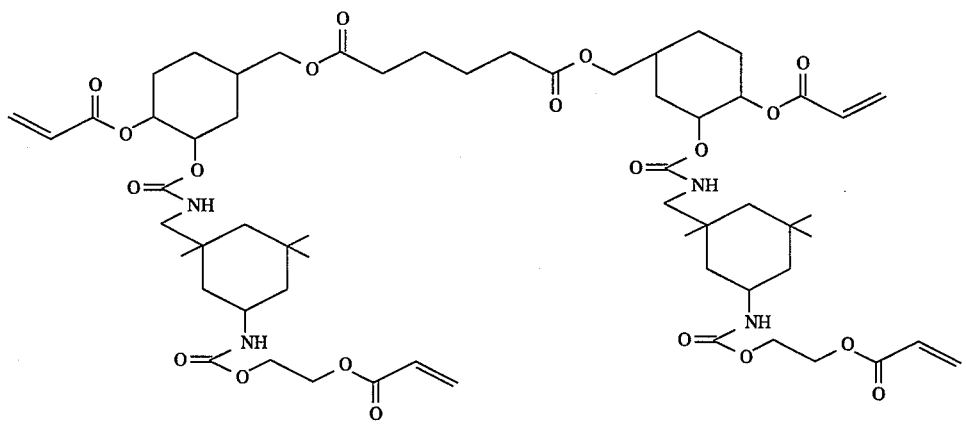

Example D (Tetraacrylate D)

50.68 g of a diacrylate which is obtainable by reacting a diglycidyl ether of polypropylene glycol (mol. wt. of the polypropylene glycol= 400) with acrylic acid in the molar ratio of 1:2 (OH content according to titration: 2.96 mol/kg) is slowly added dropwise at 60° C. to a solution of 22.03 ml (0.15 mol) of 2,4-toluylene diisocyanate and 0.05 g of Ralox® and the reaction solution is stirred for 7 h at 60° C. The isocyanate content of the reaction solution determined by titration is at this time 2.21 mol/kg (theory: 1.95 mol/kg).

The temperature of the reaction solution is then lowered to 40° C. and 0.14 g of tin octoate and 19.73 ml (0.17 mol) of hydroxyethyl acrylate (Fluka; 90% pure) are added dropwise to the reaction solution. The reaction solution is further stirred until the isocyanate groups disappear. After 5 h analysis by GPC shows the resultant tetraacrylate to have a Mn of 944 and a Mw/Mn of 2.72.

Microhydrogenation is carried out in the presence of a Pd/C catalyst (5% Pd on carbon) in dimethyl acetamide to an absorption of 2.9 mmol of $H_2$/g, showing that 4 acrylate groups are present in the molecule. The resultant tetraacrylate has the formula

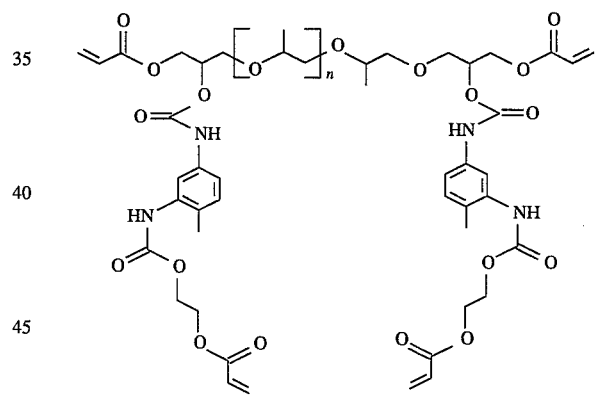

where n= 6–7.

Example 1

35 g of the tetraacrylate A prepared in Example A are mixed at 60° C. with 20 g of a polyethylene glycol 400 diacrylate (SR®344, a commercial product sold by Sartomer), 30 g of an ethoxylated dimethacrylate of bisphenol A (SR®348, Sartomer) and 10 g of tripropylene glycol diacrylate (SR®306, Sartomer). Then 4.85 g of 1-hydroxycyclohexyl phenyl ketone (Irgacure®184, CIBA-GEIGY) and 0.15 g of hydroquinone monomethyl ether are added, and the mixture is stirred until a clear homogeneous mixture forms.

Objects are produced by irradiating the mixture with a He/Cd laser at an intensity of 40 mJ/cm². The objects (green models) obtained by the laser cure have the following properties:

| | |
|---|---|
| modulus of elasticity according to DIN 53 371 | = 86 N/mm²; |
| elongation at break according to DIN 53 455 | = 17%. |

To effect the full cure, the green models are irradiated for 30 minutes (min) with UV light. The objects so obtained have the following properties:

| | |
|---|---|
| modulus of elasticity | = 2289 N/mm² |
| elongation at break | = 8% |
| The dimensions of the objects are typically; | |
| length | = 50 mm; |
| cross-section | = 1.2 × 0.3 mm. |

The elongation at break of the objects is determined with a Lloyd®500 tensile strength tester (supplied by Lloyd).

Example 2

In the same manner as described in Example 1, a clear homogeneous mixture is prepared at 60° C. from 35 g of tetraacrylate B prepared in Example B, 20 g of SR®344, 30 g of SR®348, 10 g of SR®306, 4.85 g of Irgacure 184 and 0.15 g of hydroquinone monomethyl ether. The green models produced by irradiating the mixture with the He/Cd laser have the following properties:

| | |
|---|---|
| modulus of elasticity (DIN 53 371) | = 30 N/mm² |
| elongation at break (DIN 53 455) | = 19% |
| The objects cured by UV irradiation for 30 min have the following properties: | |
| modulus of elasticity (DIN 53 371) | = 2087 N/mm² |
| elongation at break (DIN 53 455) | = 5%. |

To determine the impact strength, the photopolymerisable composition prepared above is cast between two glass plates spaced 4 mm apart and cured for 30 min by irradiation with UV light:

| | |
|---|---|
| impact strength (DIN 52 453) | = 14 kJ/m². |

Example 3

In the same manner as described in Example 1, a clear homogeneous mixture is prepared at 60° C. from 35 g of tetraacrylate C prepared in Example C, 20 g of SR®344, 30 g of SR®348, 10 g of SR®306, 4.85 g of Irgacure 184 and 0.15 g of hydroquinone monomethyl ether. The green models produced by irradiating the mixture with the He/Cd laser have the following properties:

| | |
|---|---|
| modulus of elasticity (DIN 53 371) | = 16 N/mm² |
| elongation at break (DIN 53 455) | = 16% |
| The objects cured by UV irradiation for 30 min have the following properties: | |
| modulus of elasticity (DIN 53 371) | = 2012 N/mm² |
| elongation at break (DIN 53 455) | = 6%. |

To determine the impact strength, the photopolymerisable composition prepared above is cast between two glass plates spaced 4 mm apart and cured for 30 min by irradiation with UV light. Objects measuring 50×10×4 mm are produced:

| | |
|---|---|
| impact strength (DIN 52 453) | = 14 kJ/m². |

What is claimed is:

1. A photopolymerisable composition for use in a stereolithographic process comprising (a) 5 to 75% by weight of a tetraacrylate of formula I or II

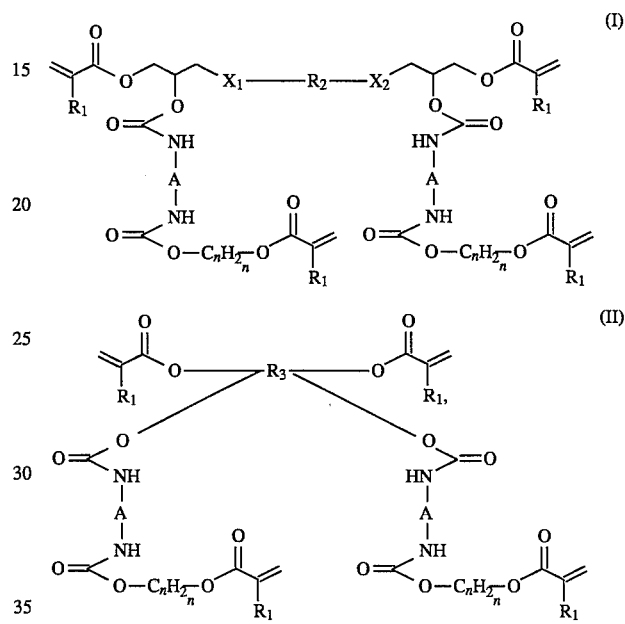

wherein $R_1$ is a hydrogen atom or methyl, $X_1$ and $X_2$ are each independently of the other —O— or —CO—O—, $R_2$ is a divalent aliphatic, cycloaliphatic or aromatic radical of a diglycidyl compound that contains no more glycidyl ether or ester groups, A is a divalent aliphatic, cycloaliphatic or aromatic radical of a diisocyanate compound that contains no more isocyanate groups, n is an integer from 1 to 8, and $R_3$ is a tetravalent cycloaliphatic radical of a diepoxide compound that contains no more 1,2-epoxide groups at the cycloaliphatic ring, (b) 25 to 95% by weight of at least one liquid radically polymerisable compound that differs from component a), the amount of components (a) and (b) together being 100% by weight and (c) 0.1 to 10% by weight of a radical photoinitiator.

2. A composition according to claim 1, wherein component (a) is a tetraacrylate of formula I or II, wherein $R_1$ is a hydrogen atom or methyl, $X_1$ and $X_2$ are each —O— or —CO—O—, $R_2$ is a divalent linear or branched hydrocarbon radical of up to 20 carbon atoms, a radical of formula-(alkylene-O)$_m$-alkylene-, in which alkylene contains 1 to 8 carbon atoms and m is 0 or an integer from 1 to 100, also

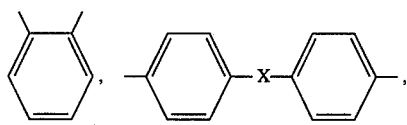

in which

X is linear or branched alkylene of 1 to 6 carbon atoms,

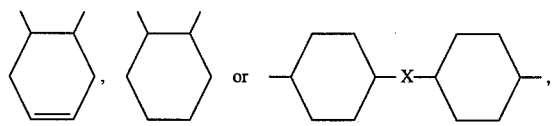

in which X is as defined above,

A is a divalent aliphatic hydrocarbon radical of up to 6 carbon atoms, an unsubstituted or a methyl-substituted phenylene radical, a radical of formula

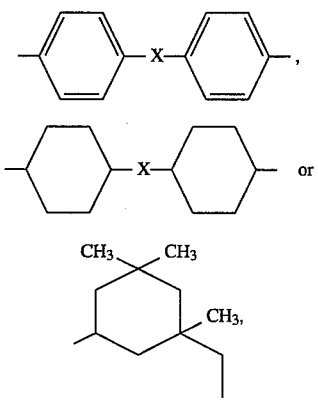

in which X is as defined above, and R$_3$ is a radical of formula

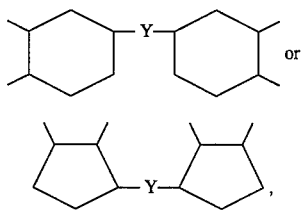

in which Y is —CO—O—CH$_2$—, —CO—O— (CH$_2$)$_p$—O—CO— or —CH$_2$—O—CO— (CH$_2$)$_p$—CO—O—CH$_2$—, and p is an integer from 2 to 12.

3. A composition according to claim 1, comprising as component (b) at least one liquid (meth)acrylate that differs from component (a) and has an acrylate functionality of 1 to 9.

4. A composition according to claim 1, comprising as component (b) a liquid mixture of aromatic, aliphatic or cycloaliphatic (meth)acrylates that have an acrylate functionality of 1 to 9.

5. A composition according to claim 1, comprising as component (b) a liquid mixture of at least one polyalkylene glycol (meth)acrylate and at least one aromatic, aliphatic or cycloaliphatic (meth)acrylate having an acrylate functionality of 1 to 9.

6. A composition according to claim 1, comprising 10 to 50% by weight of a compound of formula I or II as component (a), 50 to 90% by weight of component (b), the amount of components (a) and (b) together being 100% by weight, and 0.1 to 10% by weight, based on the amount of (a) and (b), of component (c).

7. A process for the production of three-dimensional objects from a novel liquid composition as claimed in claim 1 by a lithographic technique, which comprises irradiating a layer of novel liquid composition over the entire surface or in a predetermined pattern with actinic light from a UV/VIS source, such that within the irradiated areas a layer solidifes in a desired layer thickness, then a new layer of novel composition is formed on the solidified layer, which layer is likewise irradiated over the entire surface or in a predetermined pattern, and such that three-dimensional objects are formed from a plurality of solidified layers which adhere to one another by repeated coating and irradiation.

8. A process according to claim 1, which comprises using a laser beam, preferably a computer-controlled laser beam, as light source.

9. A three-dimensional object which is obtained by irradiating a novel composition as claimed in claim 1 with actinic light and which is formed from a plurality of solidified layers which adhere to one another.

* * * * *